(12) United States Patent
Kitada et al.

(10) Patent No.: US 11,223,007 B2
(45) Date of Patent: Jan. 11, 2022

(54) PIEZOELECTRIC ELEMENT, LIQUID EJECTION HEAD, AND PRINTER

(71) Applicant: Seiko Epson Corporation, Tokyo (JP)

(72) Inventors: Kazuya Kitada, Matsumoto (JP); Katsutomo Tsukahara, Shiojiri (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/081,282

(22) Filed: Oct. 27, 2020

(65) Prior Publication Data

US 2021/0126186 A1 Apr. 29, 2021

(30) Foreign Application Priority Data

Oct. 28, 2019 (JP) .............................. JP2019-195074

(51) Int. Cl.
| | |
|---|---|
| *H01L 41/18* | (2006.01) |
| *H01L 41/187* | (2006.01) |
| *B41J 2/14* | (2006.01) |
| *H01L 41/047* | (2006.01) |
| *H01L 41/09* | (2006.01) |

(52) U.S. Cl.
CPC ...... *H01L 41/1873* (2013.01); *B41J 2/14201* (2013.01); *H01L 41/0477* (2013.01); *H01L 41/0973* (2013.01)

(58) Field of Classification Search
None
See application file for complete search history.

(56) References Cited

U.S. PATENT DOCUMENTS

| | | | |
|---|---|---|---|
| 2008/0308762 A1 | 12/2008 | Ueno et al. | |
| 2015/0207057 A1* | 7/2015 | Sakuma | G11B 21/24 360/294.4 |
| 2017/0229637 A1* | 8/2017 | Sakai | B41J 2/1628 |
| 2018/0138392 A1 | 5/2018 | Isshiki et al. | |
| 2018/0138393 A1 | 5/2018 | Sumi et al. | |
| 2019/0181328 A1* | 6/2019 | Sumi | H01L 41/318 |

FOREIGN PATENT DOCUMENTS

| | | |
|---|---|---|
| EP | 3499594 A1 | 6/2019 |
| JP | 2011-155272 A | 8/2011 |
| JP | 2018-082052 A | 5/2018 |

* cited by examiner

*Primary Examiner* — Erica S Lin
(74) *Attorney, Agent, or Firm* — Harness, Dickey & Pierce, P.L.C.

(57) ABSTRACT

A piezoelectric element includes a first electrode provided at a base body, a piezoelectric layer provided at the first electrode and containing a composite oxide that contains potassium, sodium, and niobium and that has a perovskite structure, and a second electrode provided at the piezoelectric layer, wherein the first electrode is a platinum layer, the first electrode is preferentially oriented to (111), and the first electrode has an average crystal grain diameter of 200 nm or more.

4 Claims, 10 Drawing Sheets

FIG. 9

| | FIRST ELECTRODE | | | PIEZOELECTRIC LAYER | | |
|---|---|---|---|---|---|---|
| | DEPOSITION TEMPERATURE[°C] | AVERAGE CRYSTAL GRAIN DIAMETER[nm] | SURFACE ROUGHNESS Rq[nm] | $I_{(100)}$ | $I_{(111)}$ | RATIO $I_{(100)}/I_{(111)}$ |
| EXAMPLE 1 | 450 | 260 | 2.05 | 1445 | 10 | 144.5 |
| EXAMPLE 2 | 350 | 218 | 2.35 | 1295 | 7 | 185.0 |
| COMPARATIVE EXAMPLE 1 | 250 | 62 | 3.15 | 1845 | 51 | 36.2 |

PIEZOELECTRIC ELEMENT, LIQUID EJECTION HEAD, AND PRINTER

The present application is based on, and claims priority from JP Application Serial Number 2019-195074, filed on Oct. 28, 2019, the disclosure of which is hereby incorporated by reference herein in its entirety.

BACKGROUND

1. Technical Field

The present disclosure relates to a piezoelectric element, a liquid ejection head, and a printer.

2. Related Art

The development of a lead-free piezoelectric material in which the use of a toxic substance such as lead is avoided has been advanced from the viewpoint of reduction of environmental load. As such a lead-free piezoelectric material, potassium sodium niobate (($K,Na)NbO_3$: KNN) has been considered promising.

For example, JP-A-2011-155272 (Patent Document 1) describes that a piezoelectric layer composed of KNN is preferentially oriented to (100) using an orientation control layer composed of lanthanum nickelate.

However, in Patent Document 1, lanthanum nickelate to serve as the orientation control layer is sometimes diffused in the piezoelectric layer. This sometimes causes an increase in leakage current of a piezoelectric element. Therefore, the orientation of the piezoelectric layer containing potassium, sodium, and niobium is required to be controlled without using lanthanum nickelate as the orientation control layer.

SUMMARY

A piezoelectric element according to one aspect of the present disclosure includes a first electrode provided at a base body; a piezoelectric layer provided at the first electrode and containing a composite oxide that contains potassium, sodium, and niobium and that has a perovskite structure; and a second electrode provided at the piezoelectric layer, in which the first electrode is a platinum layer, the first electrode is preferentially oriented to (111), and the first electrode has an average crystal grain diameter of 200 nm or more.

In the piezoelectric element according to the aspect of the present disclosure, the first electrode may have a surface roughness Rq of 2.20 nm or more.

In the piezoelectric element according to the aspect of the present disclosure, the base body may include a zirconium oxide layer, and the first electrode may be provided at the zirconium oxide layer.

A liquid ejection head according to one aspect of the present disclosure includes: the piezoelectric element according to any one aspect of the present disclosure; and a nozzle plate provided with a nozzle hole for ejecting a liquid, in which the base body includes a flow path forming substrate provided with a pressure generating chamber whose volume is changed by the piezoelectric element, and the nozzle hole communicates with the pressure generating chamber.

A printer according to one aspect of the present disclosure includes: the liquid ejection head according to the aspect of the present disclosure; a conveyance mechanism for relatively moving a recording medium with respect to the liquid ejection head; and a control unit that controls the liquid ejection head and the conveyance mechanism.

BRIEF DESCRIPTION OF THE DRAWINGS

FIG. 9 is a table showing the deposition temperature and the average crystal grain diameter of the first electrode and the ratio $I_{(100)}/I_{(111)}$ of a piezoelectric layer.

DESCRIPTION OF EXEMPLARY EMBODIMENTS

Hereinafter, preferred embodiments of the present disclosure will be described in detail with reference to the drawings. Note that the embodiments described below are not intended to unduly limit the content of the present disclosure described in the appended claims. Further, not all the configurations described below are necessarily essential components of the present disclosure.

1. PIEZOELECTRIC ELEMENT

Figure 1:
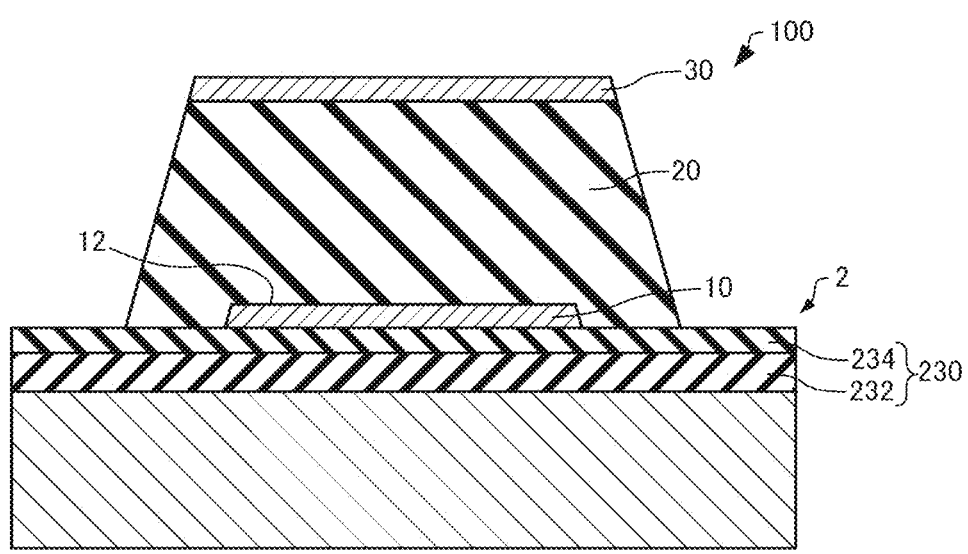
FIG. 1 is a cross-sectional view schematically showing a piezoelectric element according to an embodiment.

First, a piezoelectric element according to this embodiment will be described with reference to the drawings. FIG. 1 is a cross-sectional view schematically showing a piezoelectric element 100 according to this embodiment.

As shown in FIG. 1, the piezoelectric element 100 includes a first electrode 10, a piezoelectric layer 20, and a second electrode 30. The piezoelectric element 100 is provided on a base body 2.

The base body 2 is, for example, a flat plate formed of a semiconductor, an insulator, or the like. The base body 2 may be a single layer or a stacked body in which a plurality of layers are stacked. The internal structure of the base body 2 is not limited as long as an upper face has a planar shape, and may be a structure in which a space or the like is formed inside.

In the example shown in the drawing, the base body 2 includes a vibration plate 230. The vibration plate 230 has flexibility and is deformed by the action of the piezoelectric layer 20. The vibration plate 230 includes a silicon oxide layer 232 and a zirconium oxide layer 234 provided on the silicon oxide layer 232. The silicon oxide layer 232 is, for example, an SiO$_2$ layer. The zirconium oxide layer 234 is, for example, a ZrO$_2$ layer.

The first electrode 10 is provided at the base body 2. In the example shown in the drawing, the first electrode 10 is provided on the zirconium oxide layer 234 of the base body 2. The first electrode 10 is provided between the base body 2 and the piezoelectric layer 20. The form of the first electrode 10 is a layer form. The thickness of the first electrode 10 is, for example, 3 nm or more and 200 nm or less, preferably 10 nm or more and 100 nm or less. The first electrode 10 is a platinum layer. The material of the first electrode 10 is platinum.

The first electrode 10 is preferentially oriented to (111). Here, the phrase "the first electrode 10 is preferentially oriented to (111)" refers to that in an X-ray diffraction intensity curve obtained by X-ray diffraction (XRD) measurement, the ratio of a peak intensity ($I_{(111)}$) derived from the (111) plane of the first electrode 10 to the sum of all peak intensities ($I_{ALL}$) derived from the first electrode 10 ($I_{(111)}/I_{ALL}$) is 0.70 or more.

The first electrode 10 is a polycrystal. The average crystal grain diameter of the first electrode 10 is 200 nm or more, preferably 210 nm or more and 300 nm or less. The average crystal grain diameter of the first electrode 10 can be determined from an SEM image of the first electrode 10 obtained using a scanning electron microscope (SEM).

The surface roughness Rq of the first electrode 10 is, for example, 2.20 nm or more, preferably 2.30 nm or more and 3.5 nm or less. The "surface roughness Rq of the first electrode 10" is a root mean square of an upper face 12 of the first electrode 10. The surface roughness Rq of the first electrode 10 can be determined by measuring the upper face 12 using an atomic force microscope (AFM).

The first electrode 10 is one electrode for applying a voltage to the piezoelectric layer 20. The first electrode 10 is a lower electrode provided below the piezoelectric layer 20.

The piezoelectric layer 20 is provided at the first electrode 10. In the example shown in the drawing, the piezoelectric layer 20 is provided on the first electrode 10 and on the base body 2. The piezoelectric layer 20 is provided between the first electrode 10 and the second electrode 30. The thickness of the piezoelectric layer 20 is, for example, 200 nm or more and 2 μm or less. The piezoelectric layer 20 can be deformed by applying a voltage between the first electrode 10 and the second electrode 30.

The piezoelectric layer 20 contains a composite oxide that contains potassium (K), sodium (Na), and niobium (Nb) and that has a perovskite structure. The piezoelectric layer 20 is, for example, a KNN layer composed of KNN. The piezoelectric layer 20 may further contain manganese (Mn). That is, the piezoelectric layer 20 may be a KNN layer with added manganese. By containing manganese in the piezoelectric layer 20, the leakage current of the piezoelectric element 100 can be reduced. In this manner, the piezoelectric layer 20 may contain an additive other than potassium, sodium, niobium, and oxygen (O).

The peak intensity ratio $I_{(100)}/I_{(111)}$ of the piezoelectric layer 20 is, for example, 100 or more. Note that the $I_{(100)}$ in the ratio "$I_{(100)}/I_{(111)}$" is a value obtained by subtracting the background intensity from the peak intensity derived from the (100) plane of the piezoelectric layer 20. Further, the $I_{(111)}$ in the ratio "$I_{(100)}/I_{(111)}$" is a value obtained by subtracting the background intensity from the peak intensity derived from the (111) plane of the piezoelectric layer 20. Hereinafter, "the ratio $I_{(100)}/I_{(111)}$ of the piezoelectric layer 20" is also referred to as "the (100) orientation ratio of the piezoelectric layer 20".

Here, with respect to a plane orientation, the crystal structure of the piezoelectric layer 20 is treated as a pseudo-cubic crystal. This is to simplify the explanation because it is difficult to accurately identify the crystal structure of the piezoelectric layer 20 in a thin film form. However, with respect to a plane orientation, the treatment of the crystal structure of the piezoelectric layer 20 as a pseudo-cubic crystal does not deny that the crystal structure of the piezoelectric layer 20 is, for example, an ABO$_3$ structure with lower symmetry than a pseudo-cubic crystal such as a tetragonal crystal, an orthorhombic crystal, a monoclinic crystal, or a rhombohedral crystal.

In the piezoelectric element 100, a layer such as a titanium oxide layer, a titanium layer, or a lanthanum nickelate layer (hereinafter also referred to as "a titanium oxide layer or the like") is not provided between the piezoelectric layer 20 and the first electrode 10. When a titanium oxide layer or the like is provided between the piezoelectric layer 20 and the first electrode 10, a component of the titanium oxide layer or the like is diffused in the piezoelectric layer 20 by firing for crystalizing the piezoelectric layer 20, and the (100) orientation ratio of the piezoelectric layer 20 decreases.

In addition, in the piezoelectric element 100, a titanium oxide layer or the like is not provided between the first electrode 10 and the base body 2. When a titanium oxide layer or the like is provided between the first electrode 10 and the base body 2, the (100) orientation ratio of the piezoelectric layer 20 decreases in the same manner as the case where a titanium oxide layer or the like is provided between the piezoelectric layer 20 and the first electrode 10. In the example shown in the drawing, the piezoelectric layer 20 is in contact with the first electrode 10, and the first electrode 10 is in contact with the base body 2.

The second electrode 30 is provided at the piezoelectric layer 20. In the example shown in the drawing, the second electrode 30 is provided on the piezoelectric layer 20. Although not shown in the drawing, the second electrode 30 may be further provided on a side face of the piezoelectric layer 20 and on the base body 2 as long as the second electrode 30 is electrically separated from the first electrode 10.

The form of the second electrode 30 is, for example, a layer form. The thickness of the second electrode 30 is, for example, 15 nm or more and 300 nm or less. The second electrode 30 is, for example, a metal layer such as an iridium layer, a platinum layer, or a ruthenium layer, an electrically conductive oxide layer thereof, a strontium ruthenate (SrRuO$_3$: SRO) layer, a lanthanum nickelate (LaNiO$_3$: LNO) layer, or the like. The second electrode 30 may have a structure in which a plurality of layers exemplified above are stacked.

The second electrode 30 is the other electrode for applying a voltage to the piezoelectric layer 20. The second electrode 30 is an upper electrode provided on the piezoelectric layer 20.

The piezoelectric element 100 has, for example, the following characteristics.

In the piezoelectric element 100, the first electrode 10 is a platinum layer, the first electrode 10 is preferentially oriented to (111), and the average crystal grain diameter of the first electrode 10 is 200 nm or more. Therefore, as shown in the below-mentioned "5. Examples and Comparative Example", in the piezoelectric element 100, the (100) orientation ratio of the piezoelectric layer 20 can be increased as compared with the case where the average crystal grain diameter of the first electrode is less than 200 nm. In this manner, in the piezoelectric element 100, the orientation of the piezoelectric layer 20 can be controlled without using an orientation control layer.

Meanwhile, according to the experiences of the present inventor, it has been found that a crack is less likely to occur in a (100)-oriented region of a KNN layer than in a non-(100)-oriented region (for example, a (111)-oriented region) of a KNN layer. In the piezoelectric element 100, the (100) orientation ratio of the piezoelectric layer 20 is high, and therefore, a crack is less likely to occur in the piezoelectric layer 20.

In the piezoelectric element 100, the surface roughness Rq of the first electrode 10 is 2.20 nm or more. Therefore, as shown in the below-mentioned "5. Examples and Comparative Example", in the piezoelectric element 100, the (100) orientation ratio of the piezoelectric layer 20 can be increased as compared with the case where the surface roughness Rq of the first electrode is less than 2.20 nm.

2. METHOD FOR PRODUCING PIEZOELECTRIC ELEMENT

Next, a method for producing the piezoelectric element 100 according to this embodiment will be described with reference to the drawings.

As shown in FIG. 1, the base body 2 is prepared. Specifically, the silicon oxide layer 232 is formed by thermal oxidation of a silicon substrate. Subsequently, a zirconium layer is formed on the silicon oxide layer 232 by a sputtering method or the like, and the zirconium oxide layer 234 is formed by thermal oxidation of the zirconium layer. By doing this, the vibration plate 230 composed of the silicon oxide layer 232 and the zirconium oxide layer 234 can be formed. By the above step, the base body 2 can be prepared.

Subsequently, the first electrode 10 is formed on the base body 2. The first electrode 10 is formed by a sputtering method. In the sputtering method, the deposition temperature is 300° C. or higher and 500° C. or lower, preferably 350° C. or higher and 450° C. or lower. The electric power is, for example, 100 W or more and 200 W or less by direct current. An introduced gas is, for example, argon (Ar) gas. The flow rate of the introduced gas is, for example, 10 sccm or more and 100 sccm or less. The pressure of the introduced gas is, for example, 0.1 Pa or more and 1.0 Pa or less. Subsequently, the first electrode 10 is patterned by, for example, photolithography and etching.

Subsequently, the piezoelectric layer 20 is formed on the first electrode 10. The piezoelectric layer 20 is formed by, for example, a chemical solution deposition (CSD) method such as a sol-gel method or a metal organic decomposition (MOD) method. Hereinafter, a method for forming the piezoelectric layer 20 will be described.

First, for example, a metal complex containing potassium, a metal complex containing sodium, a metal complex containing niobium, and a metal complex containing manganese are dissolved or dispersed in an organic solvent, thereby preparing a precursor solution.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate, niobium ethoxide, niobium pentaethoxide, and niobium pentabutoxide. Examples of the metal complex containing manganese include manganese 2-ethylhexanoate and manganese acetate. Two or more types of metal complexes may be used in combination. For example, as the metal complex containing potassium, potassium 2-ethylhexanoate and potassium acetate may be used in combination.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, 2-n-ethylhexane, and a mixed solvent thereof.

Subsequently, the prepared precursor solution is applied onto the first electrode 10 using a spin-coating method or the like, thereby forming a precursor layer. Subsequently, the precursor layer is dried for a given time by heating to, for example, 130° C. or higher and 250° C. or lower, and further, the dried precursor layer is degreased by heating to, for example, 300° C. or higher and 450° C. or lower and maintaining the layer for a given time. Subsequently, the degreased precursor layer is crystallized by firing at, for example, 550° C. or higher and 800° C. or lower.

Then, a series of steps from application of the precursor solution to firing of the precursor layer described above is repeated a plurality of times. By doing this, the piezoelectric layer 20 can be formed. Subsequently, the piezoelectric layer 20 is patterned by, for example, photolithography and etching.

A heating device used for the drying and degreasing of the precursor layer is, for example, a hot plate. A heating device used for the firing of the precursor layer is an infrared lamp annealing device (rapid thermal annealing (RTA) device).

Subsequently, the second electrode 30 is formed on the piezoelectric layer 20. The second electrode 30 is formed by, for example, a sputtering method, a vacuum deposition method, or the like. Subsequently, the second electrode 30 is patterned by, for example, photolithography and etching. The second electrode 30 and the piezoelectric layer 20 may be patterned in the same step.

By the above steps, the piezoelectric element 100 can be produced.

Before forming the piezoelectric layer 20, the upper face 12 of the first electrode 10 may be subjected to oxygen plasma ashing using an oxygen plasma ashing device. By doing this, impurities such as carbon (C) adhered to the upper face 12 can be removed, and the (100) orientation ratio of the piezoelectric layer 20 can be increased. The treatment time of the oxygen plasma ashing is, for example, 0.5 minutes or more, and preferably 0.5 minutes or more and 5 minutes or less.

In addition, the upper face 12 of the first electrode 10 may be irradiated with UV at 172 nm using a UV (ultraviolet) lamp instead of oxygen plasma ashing. The UV irradiation time is, for example, 5 minutes or more and 15 minutes or less.

3. LIQUID EJECTION HEAD

Figure 2:
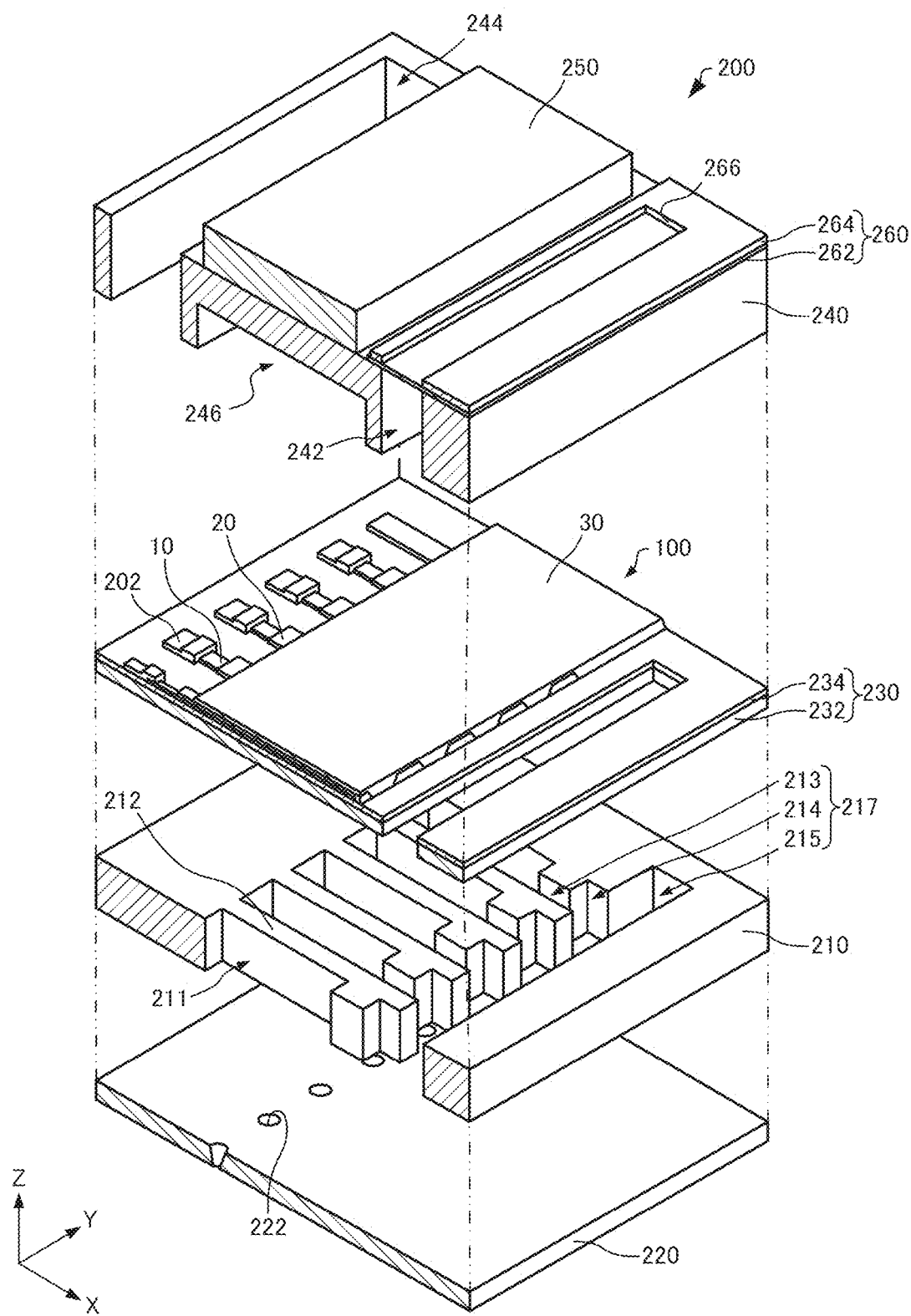
FIG. 2 is an exploded perspective view schematically showing a liquid ejection head according to an embodiment.
Figure 3:
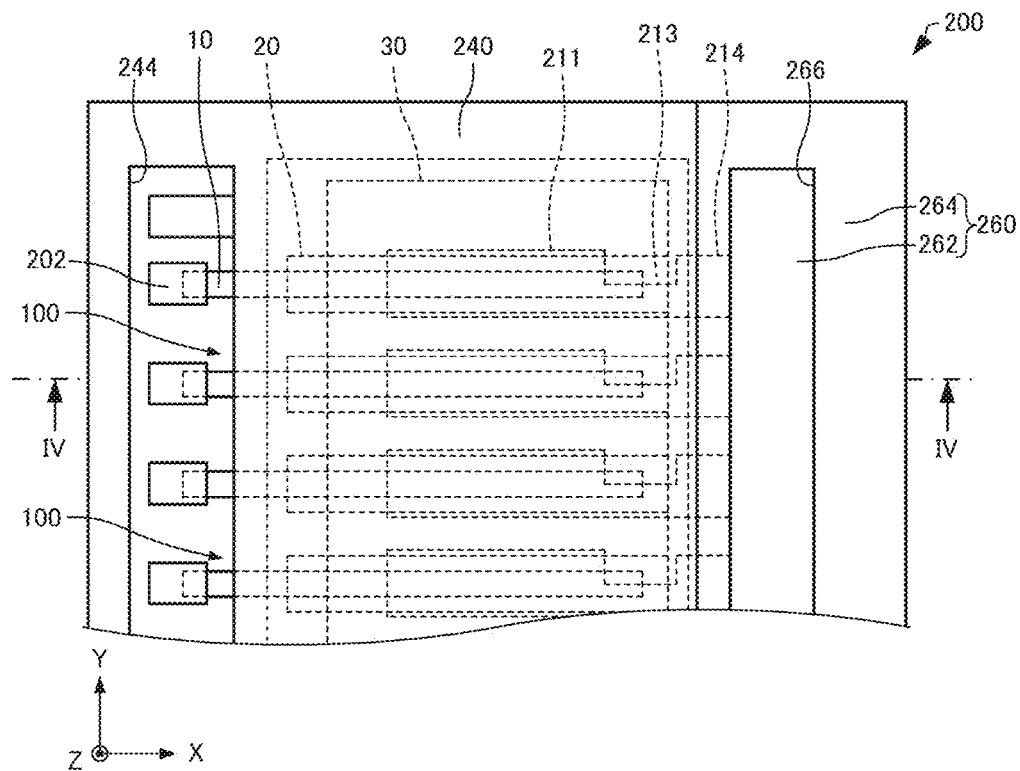
FIG. 3 is a plan view schematically showing the liquid ejection head according to the embodiment.
Figure 4:
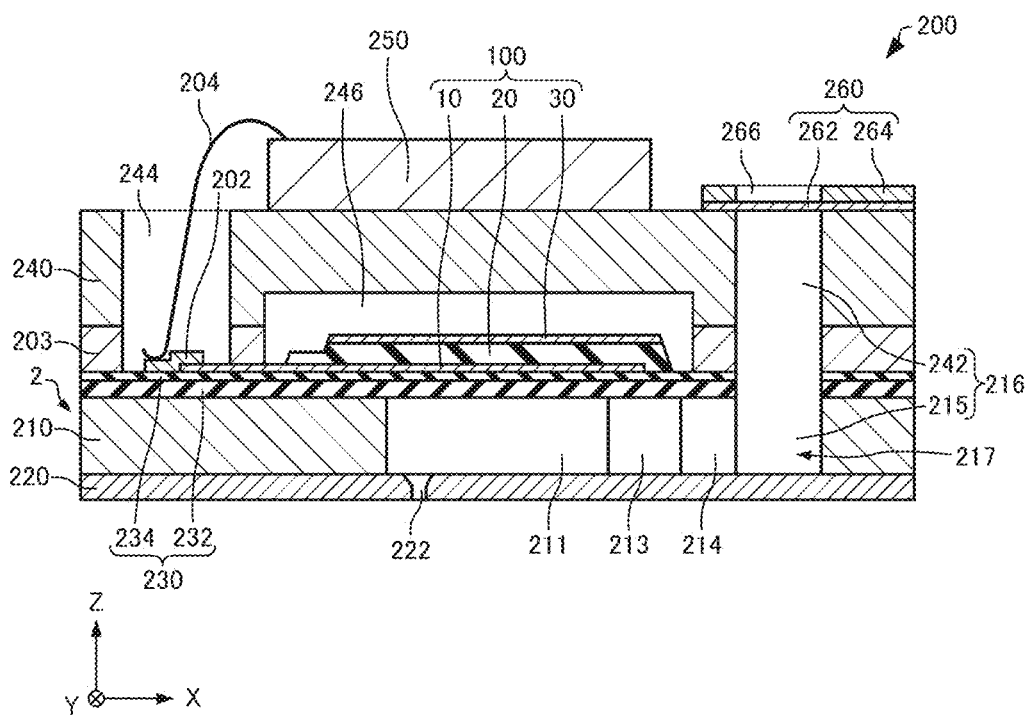
FIG. 4 is a cross-sectional view schematically showing the liquid ejection head according to the embodiment.

Next, a liquid ejection head according to this embodiment will be described with reference to the drawings. FIG. 2 is an exploded perspective view schematically showing a liquid ejection head 200 according to this embodiment. FIG. 3 is a plan view schematically showing the liquid ejection head 200 according to this embodiment. FIG. 4 is a cross-sectional view taken along the line IV-IV in FIG. 3 schematically showing the liquid ejection head 200 according to this embodiment. In FIGS. 2 to 4, an X axis, a Y axis, and a Z axis are shown as three axes orthogonal to one another.

Further, in FIGS. 2 and 4, the piezoelectric element 100 is shown in a simplified manner.

As shown in FIGS. 2 to 4, the liquid ejection head 200 includes, for example, a base body 2, a piezoelectric element 100, a nozzle plate 220, a protective substrate 240, a circuit board 250, and a compliance substrate 260. The base body 2 includes a flow path forming substrate 210 and a vibration plate 230. In FIG. 3, illustration of the circuit board 250 is omitted for the sake of convenience.

The flow path forming substrate 210 is, for example, a silicon substrate. In the flow path forming substrate 210, a pressure generating chamber 211 is provided. The pressure generating chamber 211 is divided by a plurality of partitions 212. The volume of the pressure generating chamber 211 is changed by the piezoelectric element 100.

In the flow path forming substrate 210, a first communication path 213 and a second communication path 214 are provided at an end in the positive X-axis direction of the pressure generating chamber 211. The first communication path 213 is configured such that an opening area thereof becomes smaller by narrowing the end in the positive X-axis direction of the pressure generating chamber 211 from the Y-axis direction. The width in the Y-axis direction of the second communication path 214 is, for example, the same as the width in the Y-axis direction of the pressure generating chamber 211. In the positive X-axis direction of the second communication path 214, a third communication path 215 communicating with a plurality of second communication paths 214 is provided. The third communication path 215 constitutes a part of a manifold 216. The manifold 216 becomes a liquid chamber common to the respective pressure generating chambers 211. In this manner, in the flow path forming substrate 210, a supply flow path 217 composed of the first communication path 213, the second communication path 214, and the third communication path 215, and the pressure generating chamber 211 are provided. The supply flow path 217 communicates with the pressure generating chamber 211 and supplies a liquid to the pressure generating chamber 211.

The nozzle plate 220 is provided at a face at one side of the flow path forming substrate 210. A material of the nozzle plate 220 is, for example, steel use stainless (SUS). The nozzle plate 220 is joined to the flow path forming substrate 210 with, for example, an adhesive, a heat-welding film, or the like. In the nozzle plate 220, a plurality of nozzle holes 222 are provided along the Y axis. The nozzle holes 222 communicate with the pressure generating chamber 211 and eject a liquid.

The vibration plate 230 is provided at a face at the other side of the flow path forming substrate 210. The vibration plate 230 is constituted by, for example, a silicon oxide layer 232 provided on the flow path forming substrate 210 and a zirconium oxide layer 234 provided on the silicon oxide layer 232.

The piezoelectric element 100 is, for example, provided on the vibration plate 230. A plurality of piezoelectric elements 100 are provided. The number of piezoelectric elements 100 is not particularly limited.

In the liquid ejection head 200, by deformation of the piezoelectric layer 20 having an electromechanical conversion property, the vibration plate 230 and the first electrode 10 are displaced. That is, in the liquid ejection head 200, the vibration plate 230 and the first electrode 10 substantially have a function as a vibration plate.

The first electrode 10 is constituted as an individual electrode independent for each pressure generating chamber 211. The width in the Y-axis direction of the first electrode 10 is narrower than the width in the Y-axis direction of the pressure generating chamber 211. The length in the X-axis direction of the first electrode 10 is longer than the length in the X-axis direction of the pressure generating chamber 211. In the X-axis direction, both ends of the first electrode 10 are located across both ends of the pressure generating chamber 211. To the end in the negative X-axis direction of the first electrode 10, a lead electrode 202 is coupled.

The width in the Y-axis direction of the piezoelectric layer 20 is, for example, wider than the width in the Y-axis direction of the first electrode 10. The length in the X-axis direction of the piezoelectric layer 20 is, for example, longer than the length in the X-axis direction of the pressure generating chamber 211. The end in the positive X-axis direction of the first electrode 10 is located, for example, between the end in the positive X-axis direction of the piezoelectric layer 20 and the end in the positive X-axis direction of the pressure generating chamber 211. The end in the positive X-axis direction of the first electrode 10 is covered with the piezoelectric layer 20. On the other hand, the end in the negative X-axis direction of the piezoelectric layer 20 is located, for example, between the end at the negative X-axis direction side of the first electrode 10 and the end in the positive X-axis direction of the pressure generating chamber 211. The end at the negative X-axis direction side of the first electrode 10 is not covered with the piezoelectric layer 20.

The second electrode 30 is, for example, continuously provided on the piezoelectric layer 20 and the vibration plate 230. The second electrode 30 is constituted as a common electrode common to the plurality of piezoelectric elements 100.

The protective substrate 240 is joined to the flow path forming substrate 210 with an adhesive 203. In the protective substrate 240, a through hole 242 is provided. In the example shown in the drawing, the through hole 242 passes through the protective substrate 240 in the Z-axis direction and communicates with the third communication path 215. The through hole 242 and the third communication path 215 constitute the manifold 216 to serve as a liquid chamber common to the respective pressure generating chambers 211. Further, in the protective substrate 240, a through hole 244 passing through the protective substrate 240 in the Z-axis direction is provided. In the through hole 244, an end of the lead electrode 202 is located.

In the protective substrate 240, an opening portion 246 is provided. The opening portion 246 is a space for preventing inhibition of driving of the piezoelectric element 100. The opening portion 246 may be sealed or may not be sealed.

The circuit board 250 is provided on the protective substrate 240. The circuit board 250 includes a semiconductor integrated circuit (IC) for driving the piezoelectric element 100. The circuit board 250 and the lead electrode 202 are electrically coupled to each other through a coupling wire 204.

The compliance substrate 260 is provided on the protective substrate 240. The compliance substrate 260 includes a sealing layer 262 provided on the protective substrate 240, and a fixing plate 264 provided on the sealing layer 262. The sealing layer 262 is a layer for sealing the manifold 216. The sealing layer 262 has, for example, flexibility. In the fixing plate 264, a through hole 266 is provided. The through hole 266 passes through the fixing plate 264 in the Z-axis direction. The through hole 266 is provided at a position overlapping with the manifold 216 when seen from the Z-axis direction.

4. PRINTER

Figure 5:
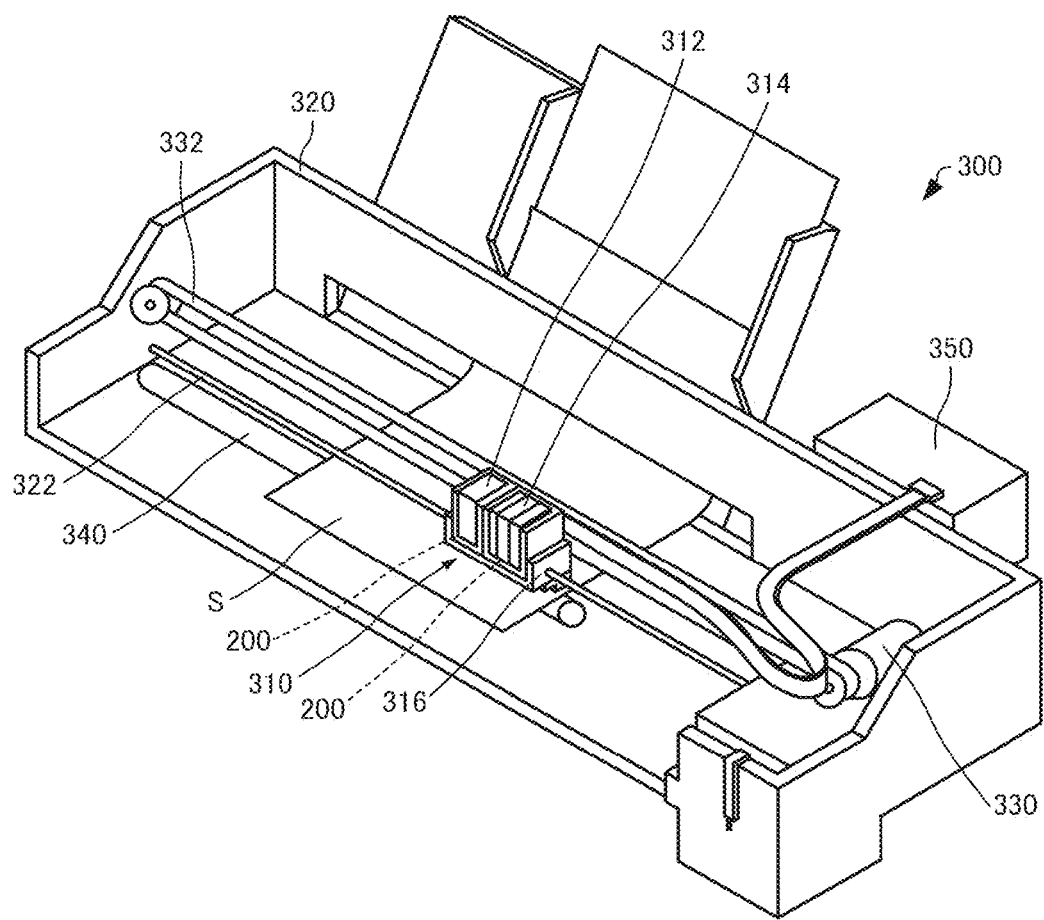
FIG. 5 is a perspective view schematically showing a printer according to an embodiment.

Next, a printer according to this embodiment will be described with reference to the drawing. FIG. 5 is a perspective view schematically showing a printer 300 according to this embodiment.

The printer 300 is an inkjet-type printer. As shown in FIG. 5, the printer 300 includes a head unit 310. The head unit 310 includes, for example, a liquid ejection head 200. The number of liquid ejection heads 200 is not particularly limited. In the head unit 310, cartridges 312 and 314 constituting a supply unit are detachably provided. A carriage 316 on which the head unit 310 is mounted is provided freely movable in an axial direction to a carriage shaft 322 attached to a device body 320 and ejects a liquid supplied from a liquid supply unit.

Here, the liquid may be any as long as it is a material in a state when a substance is a liquid phase, and a material in a liquid state like a sol, a gel, or the like is also included in the liquid. Further, not only a liquid as one state of a substance, but also a material in which particles of a functional material composed of a solid such as a pigment or metal particles are dissolved, dispersed, or mixed in a solvent, etc. are included in the liquid. Typical examples of the liquid include an ink and a liquid crystal emulsifier. The ink is assumed to include various liquid compositions such as general aqueous inks and oily inks, gel inks, and hot-melt inks.

In the printer 300, a driving force of a drive motor 330 is transmitted to the carriage 316 through a plurality of gears (not shown) and a timing belt 332, and thereby the carriage 316 on which the head unit 310 is mounted is moved along the carriage shaft 322. On the other hand, the device body 320 is provided with a conveyance roller 340 as a conveyance mechanism for relatively moving a sheet S that is a recording medium such as paper with respect to the liquid ejection head 200. The conveyance mechanism for conveying the sheet S is not limited to the conveyance roller, and may be a belt, a drum, or the like.

The printer 300 includes a printer controller 350 as a control unit that controls the liquid ejection head 200 and the conveyance roller 340. The printer controller 350 is electrically coupled to the circuit board 250 of the liquid ejection head 200. The printer controller 350 includes, for example, a random access memory (RAM) temporarily storing various data, a read only memory (ROM) storing a control program or the like, a central processing unit (CPU), and a drive signal generation circuit generating a drive signal to be supplied to the liquid ejection head 200, and the like.

The piezoelectric element 100 can be used in a wide range of applications without being limited to a liquid ejection head and a printer. The piezoelectric element 100 is favorably used as, for example, a piezoelectric actuator such as an ultrasonic motor, a vibration-type dust remover, a piezoelectric transformer, a piezoelectric speaker, a piezoelectric pump, or a pressure-electric converter. Further, the piezoelectric element 100 is favorably used as, for example, a piezoelectric-type sensor element such as an ultrasonic detector, an angular velocity sensor, an acceleration sensor, a vibration sensor, a tilt sensor, a pressure sensor, a collision sensor, a motion sensor, an infrared sensor, a Terahertz sensor, a heat detection sensor, a pyroelectric sensor, or a piezoelectric sensor. Further, the piezoelectric element 100 is favorably used as a ferroelectric element such as a ferroelectric memory (FeRAM), a ferroelectric transistor (FeFET), a ferroelectric arithmetic circuit (FeLogic), or a ferroelectric capacitor. Further, the piezoelectric element 100 is favorably used as a voltage-controlled optical element such as a wavelength converter, an optical waveguide, an optical path modulator, a refractive index control element, or an electronic shutter mechanism.

5. EXAMPLES AND COMPARATIVE EXAMPLE

5.1. Preparation of Samples

5.1.1. Example 1

In Example 1, a silicon oxide layer was formed on a silicon substrate by thermal oxidation of a 6-inch silicon substrate. Subsequently, a zirconium layer was formed on the silicon oxide layer by a sputtering method, and then, a zirconium oxide layer was formed by thermal oxidation of the zirconium layer.

Subsequently, a platinum layer having a thickness of 50 nm was formed as a first electrode on the zirconium oxide layer by a sputtering method. In the sputtering method, the deposition temperature was set to 450° C., the electric power was set to 150 W by direct current, the flow rate of Ar gas was set to 40 sccm, and the pressure of Ar gas was set to 0.4 Pa.

Subsequently, a piezoelectric layer was formed on the first electrode according to the following procedure.

A precursor solution composed of potassium 2-ethylhexanoate, sodium 2-ethylhexanoate, niobium 2-ethylhexanoate, and manganese 2-ethylhexanoate was prepared to give $(K_{0.4}Na_{0.6})(Nb_{0.995}Mn_{0.005})O_3$. Subsequently, the precursor solution was applied onto the first electrode by a spin-coating method. Thereafter, drying at 180° C. and degreasing at 350° C. were performed, and a heating treatment was performed at 750° C. for 3 minutes using an RTA device.

The above step was repeated three times, whereby a piezoelectric layer having a thickness of 250 nm was formed.

5.1.2. Example 2

In Example 2, production was performed in the same manner as in Example 1 except that the deposition temperature in the sputtering method when forming the first electrode was set to 350° C.

5.1.3. Comparative Example 1

In Comparative Example 1, production was performed in the same manner as in Example 1 except that the deposition temperature in the sputtering method when forming the first electrode was set to 250° C.

5.2. SEM Observation

SEM observation was performed for the surface of the first electrode before forming the piezoelectric layer in Examples 1 and 2 and Comparative Example 1. In the SEM observation, "Ultra 55" manufactured by Carl Zeiss AG was used. The acceleration voltage was set to 1 kV and the aperture diameter was set to 30 μm.

Figure 6:
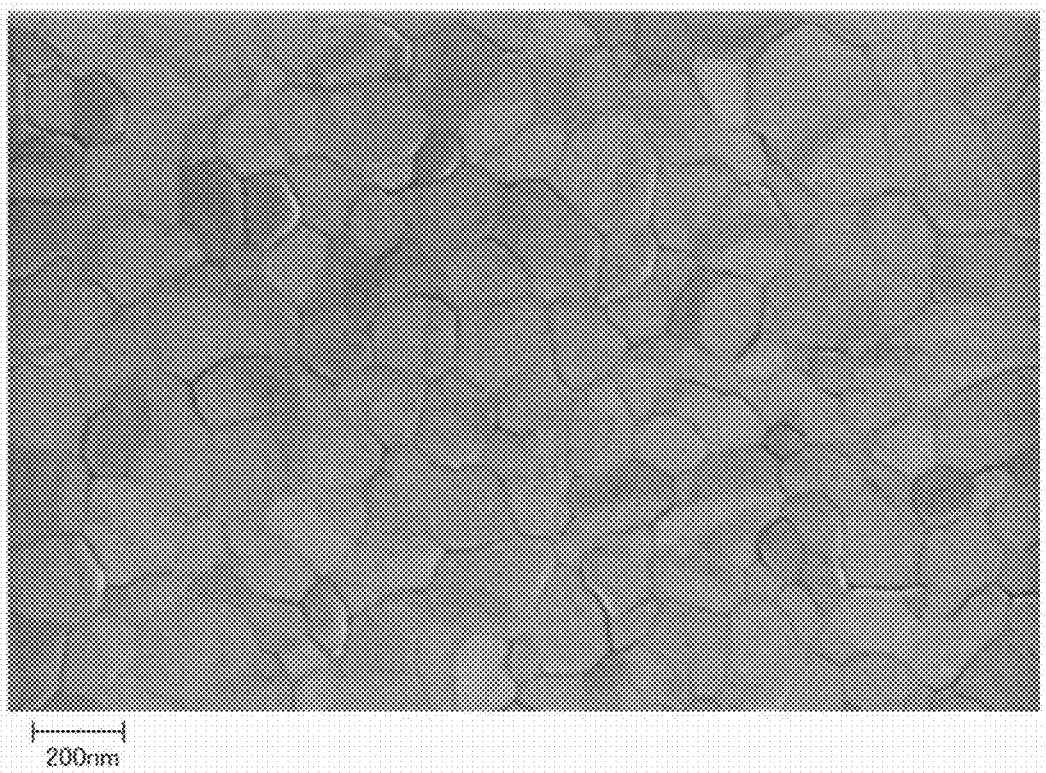
FIG. 6 is an SEM image of a first electrode of Example 1.
Figure 7:
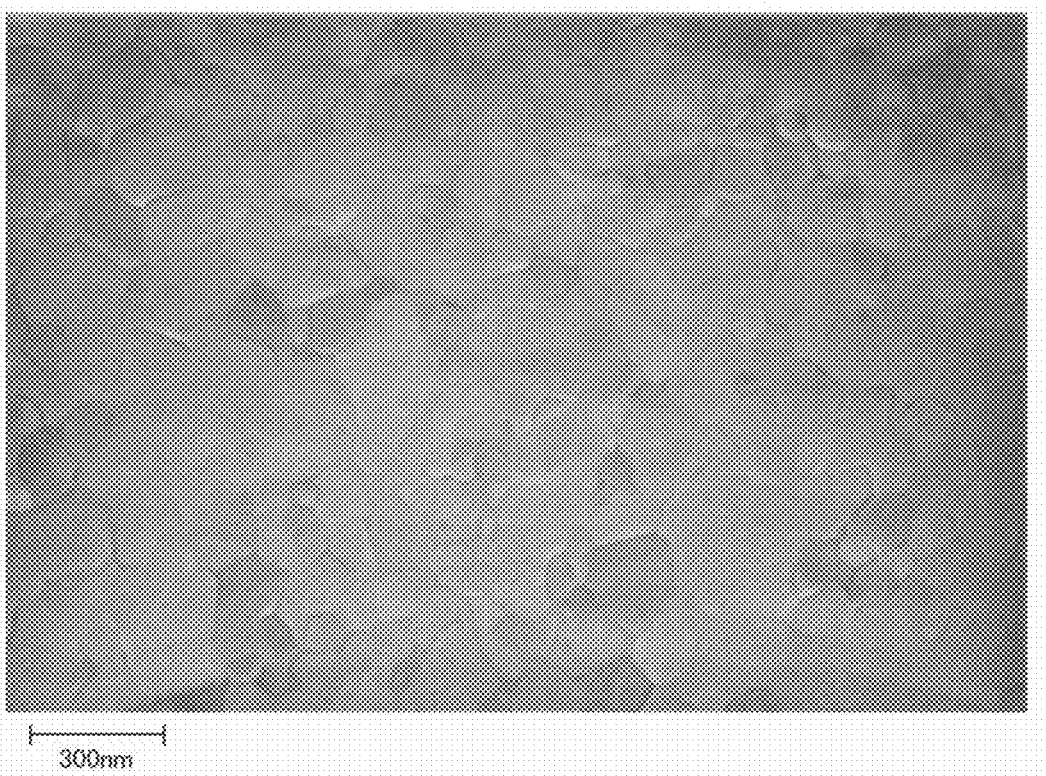
FIG. 7 is an SEM image of a first electrode of Example 2.
Figure 8:
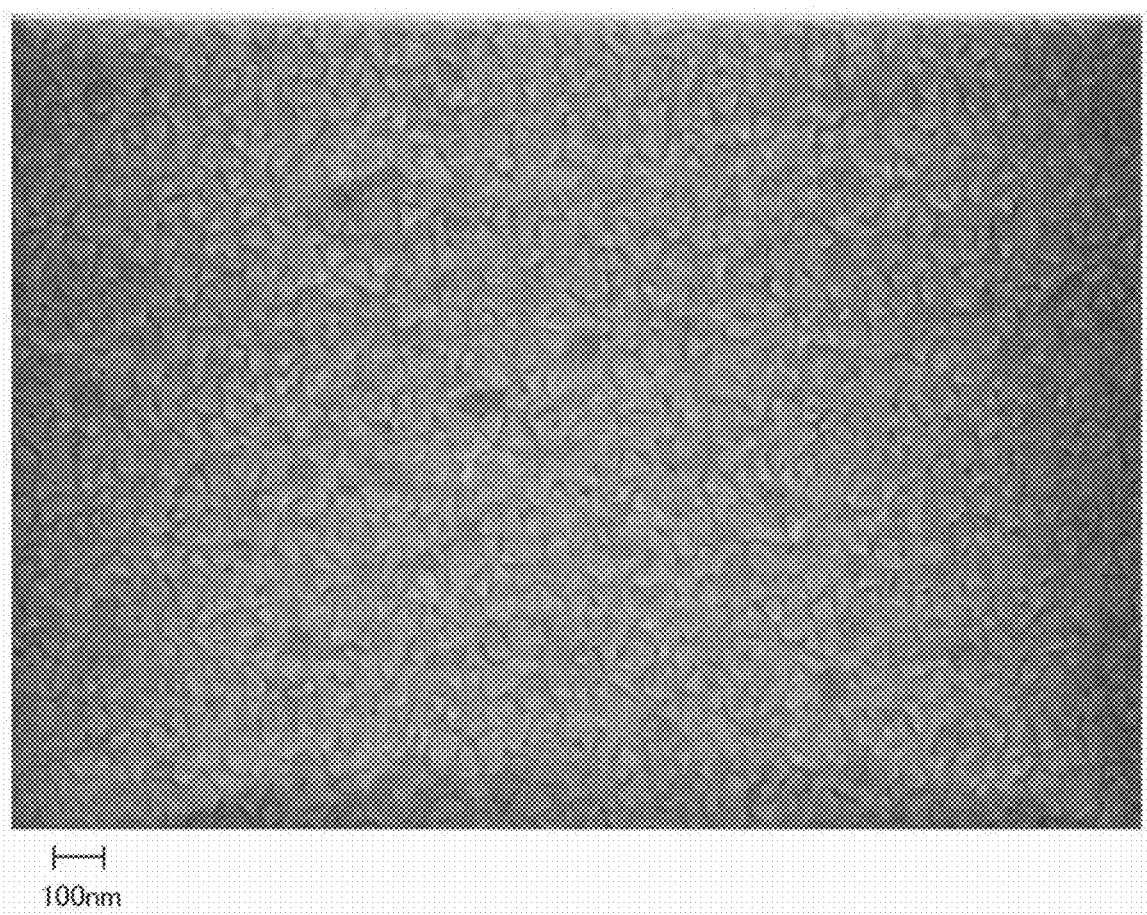
FIG. 8 is an SEM image of a first electrode of Comparative Example 1.

FIG. 6 is an SEM image of the first electrode of Example 1. FIG. 7 is an SEM image of the first electrode of Example 2. FIG. 8 is an SEM image of the first electrode of Comparative Example 1.

From the SEM images of FIGS. 6 to 8, the average crystal grain diameter of the first electrode was calculated. Hereinafter, a method for calculating the average crystal grain diameter of the first electrode will be described.

The planarly formed first electrode was observed with an SEM (scanning electron microscope). At that time, observation was performed from substantially vertically above the first electrode. That is, the first electrode was observed in plan view. Then, a 2000 nm×2000 nm square field of view was selected at random and used as a field of view for measuring the average grain diameter. An image (data) was obtained with such a resolution (resolving power) that the outline of the crystal grain in this field of view can be observed. In general, the secondary electron emission efficiency is different between a crystal grain and a crystal grain boundary, and therefore, data can be obtained at a suitable magnification while observing a crystal grain. In addition, when it is difficult to observe a crystal grain boundary, observation may be performed after, for example, performing etching or polishing to such an extent that the crystal grain of the first electrode is not destroyed. Subsequently, 5 or more crystal grains completely included in the obtained 2000 nm×2000 nm square image were selected at random. Even if the number of crystal grains completely included in the image was 1 or more and 4 or less, the average grain diameter can be calculated. Further, when there was not a single crystal grain (no crystal grain) completely included in the image, the average grain diameter was taken to be 1000 nm without calculating the average. With respect to each of the selected crystal grains, the maximum span length was measured. The maximum span length is defined as the length of the longest straight line segment that can be drawn inside without extending beyond a previously determined outline of a crystal grain. Then, the average of the maximum span lengths of the obtained respective crystal grains was defined as the average grain diameter of the crystal grains of the first electrode.

FIG. 9 is a table showing the average crystal grain diameter of the first electrode. From FIG. 9, it was found that as the deposition temperature in the sputtering method when forming the first electrode is higher, the crystal grain diameter of the first electrode becomes larger.

5.3. AFM Observation

AFM observation was performed for the surface of the first electrode before forming the piezoelectric layer in Examples 1 and 2 and Comparative Example 1. In the AFM observation, "Nanoscope III" manufactured by Digital Instruments, Inc. was used.

Figure 10:
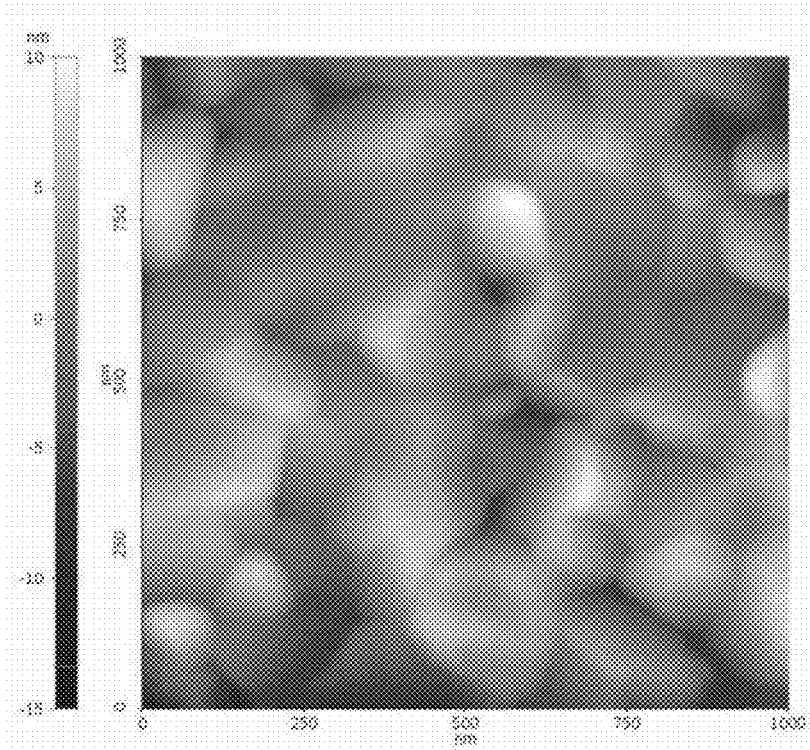
FIG. 10 is an AFM topography image of the first electrode of Example 1.
Figure 11:
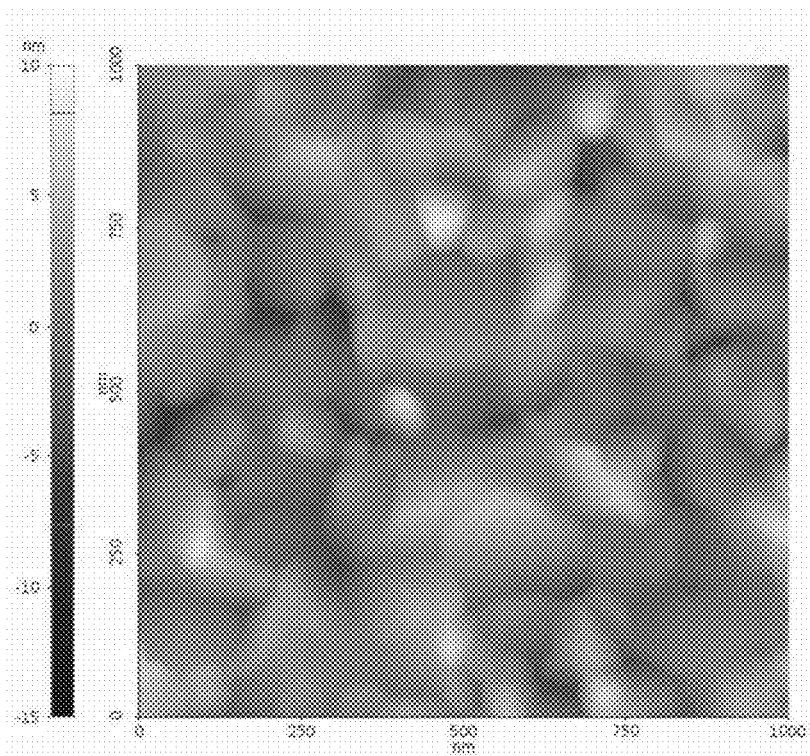
FIG. 11 is an AFM topography image of the first electrode of Example 2.
Figure 12:
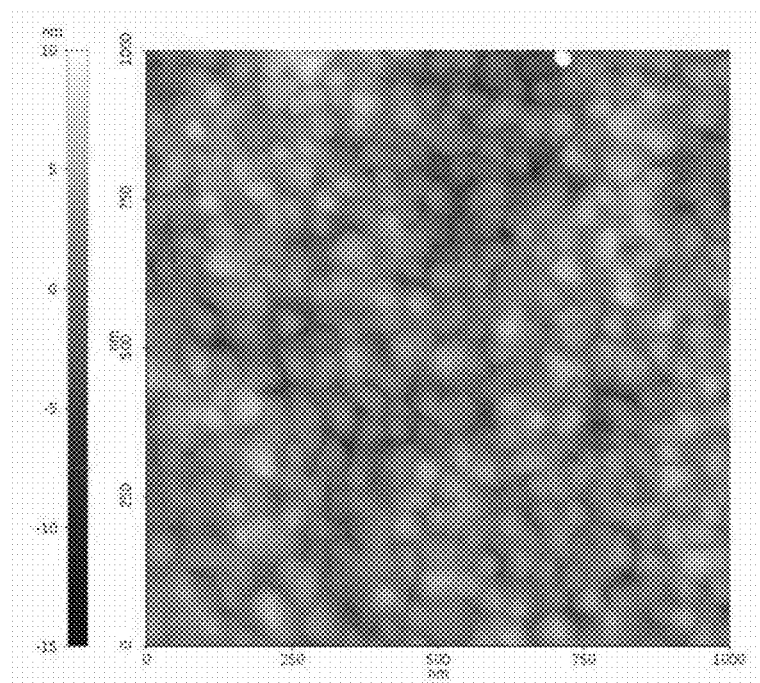
FIG. 12 is an AFM topography image of the first electrode of Comparative Example 1.

FIG. 10 is an AFM topography image of the first electrode of Example 1. FIG. 11 is an AFM topography image of the first electrode of Example 2. FIG. 12 is an AFM topography image of the first electrode of Comparative Example 1. The size of the field of view of each of the AFM topography images of FIGS. 10 to 12 is 1 μm×1 μm.

From the AFM topography images of FIGS. 10 to 12, the surface roughness Rq of the first electrode was calculated. In FIG. 9, the surface roughness Rq of the first electrode is shown. Further, FIG. 13 is a graph showing a relationship between the deposition temperature in the sputtering method when forming the first electrode and the surface roughness Rq of the first electrode.

Figure 13:
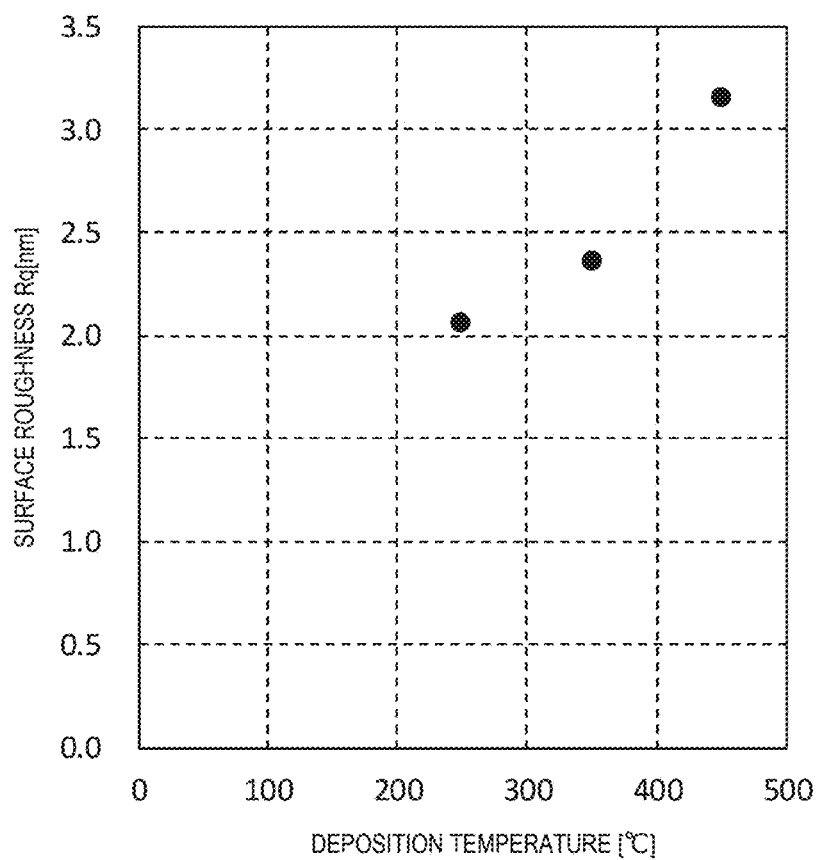
FIG. 13 is a graph showing a relationship between the deposition temperature and the surface roughness Rq of the first electrode.

From FIGS. 9 and 13, it was found that as the deposition temperature in the sputtering method when forming the first electrode is higher, the surface roughness Rq of the first electrode becomes larger.

5.4. XRD Measurement

XRD measurement was performed for the piezoelectric layer provided on the first electrode in Examples 1 and 2 and Comparative Example 1. In the XRD measurement, "D8 DISCOVER with GADDS" manufactured by Bruker, Inc. was used. Two-dimensional data were measured at a tube voltage of 50 kV, a tube current of 100 mA, a detector distance of 15 cm, a collimator diameter of 0.3 mm, and $\psi=0°$ and 54.74°. The measurement time was set to 240 sec at $\psi=0°$ and 480 sec at $\psi=54.74°$. The obtained two-dimensional data were converted to an X-ray diffraction intensity curve by the attached software with a 2θ range of 20° to 50°, a χ range of −100° to −80°, and a step width of 0.02° using Bin normalized as an intensity normalization method.

Figure 14:
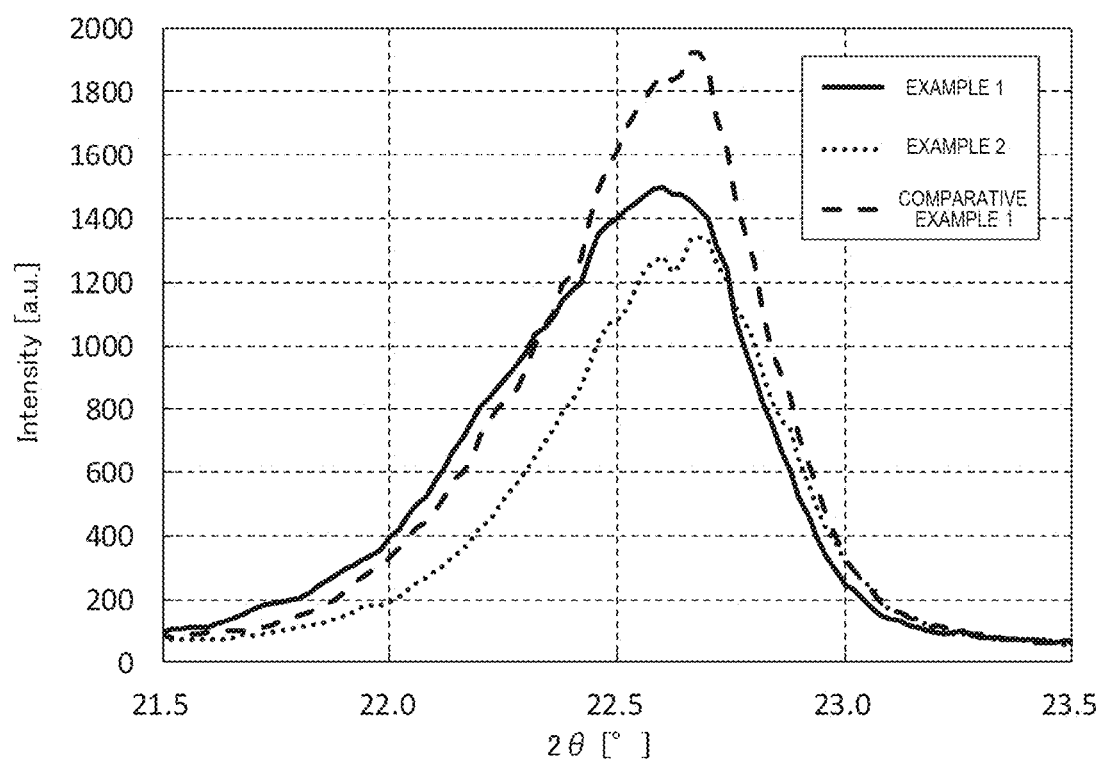
FIG. 14 shows XRD measurement results at $\psi=0°$.
Figure 15:
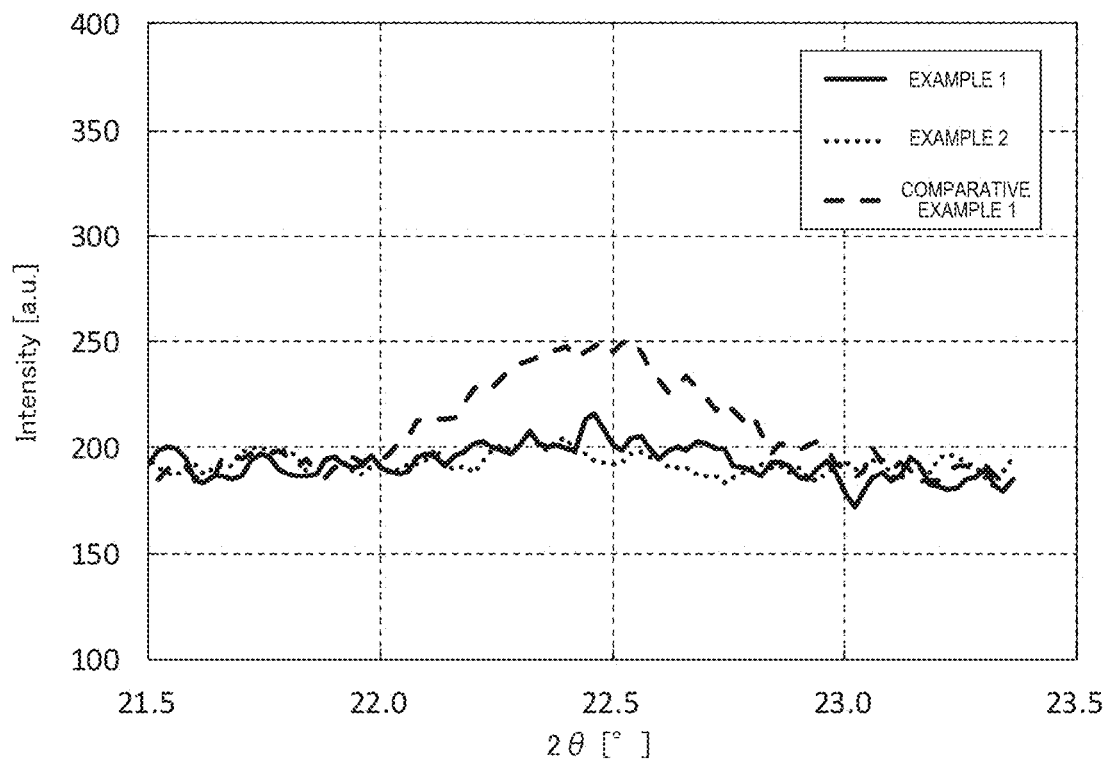
FIG. 15 shows XRD measurement results at $\psi=54.74°$.

FIG. 14 shows XRD measurement results at $\psi=0°$. FIG. 15 shows XRD measurement results at $\psi=54.74°$. By the XRD measurement at $\psi=0°$, a peak derived from the (100) plane of the piezoelectric layer can be confirmed. By the XRD measurement at $\psi=54.74°$, a peak derived from the (111) plane of the piezoelectric layer can be confirmed.

In FIG. 9, $I_{(100)}$, $I_{(111)}$, and the ratio $I_{(100)}/I_{(111)}$ of the piezoelectric layer are shown. In FIG. 9, "$I_{(100)}$" is a value obtained by subtracting "55" as the background intensity from the peak intensity derived from the (100) plane of the piezoelectric layer measured in FIG. 14. Further, "$I_{(111)}$" is a value obtained by subtracting "200" as the background intensity from the peak intensity derived from the (111) plane of the piezoelectric layer measured in FIG. 15.

As shown in FIG. 9, in Examples 1 and 2 in which the average crystal grain diameter of the first electrode is 200 μm or more, the $I_{(100)}/I_{(111)}$ intensity of the piezoelectric layer was higher than in Comparative Example 1 in which the average crystal grain diameter of the first electrode is less than 200 μm. Accordingly, it was found that by setting the average crystal grain diameter of the first electrode to 200 μm or more, the (100) orientation ratio of the piezoelectric layer can be increased.

Further, as shown in FIG. 9, in Examples 1 and 2 in which the surface roughness Rq of the first electrode is 2.20 nm or more, the $I_{(100)}/I_{(111)}$ intensity of the piezoelectric layer was higher than in Comparative Example 1 in which the surface roughness Rq of the first electrode is less than 2.20 nm.

The present disclosure is not limited to the embodiments described above, and various modifications may be made. For example, the present disclosure includes substantially the same configurations as the configurations described in the embodiments. Substantially the same configurations are, for example, configurations having the same functions, methods, and results, or configurations having the same objects and effects. Further, the present disclosure includes configurations in which non-essential parts of the configurations described in the embodiments are substituted. Further, the present disclosure includes configurations having the same effects as in the configurations described in the embodiments, or configurations capable of achieving the same objects as in the configurations described in the embodiments. In addition, the present disclosure includes configurations in which known techniques are added to the configurations described in the embodiments.

What is claimed is:

1. A piezoelectric element, comprising:
   a first electrode provided at a base body;
   a piezoelectric layer provided at the first electrode and containing a composite oxide that contains potassium, sodium, and niobium and that has a perovskite structure; and
   a second electrode provided at the piezoelectric layer,
   wherein
   the first electrode is a platinum layer, the first electrode is preferentially oriented to (111), the first electrode has an average crystal grain diameter of 200 nm or more, and the first electrode has a surface roughness Rq of 2.20 nm or more and 3.5 nm or less.

2. The piezoelectric element according to claim 1, wherein the base body includes a zirconium oxide layer, and the first electrode is provided at the zirconium oxide layer.

3. A liquid ejection head, comprising:

the piezoelectric element according to claim 1; and a nozzle plate provided with a nozzle hole for ejecting a liquid, wherein the base body includes a flow path forming substrate provided with a pressure generating chamber whose volume is changed by the piezoelectric element, and the nozzle hole communicates with the pressure generating chamber.

4. A printer, comprising:

the liquid ejection head according to claim 3;

a conveyance mechanism for relatively moving a recording medium with respect to the liquid ejection head; and a control unit that controls the liquid ejection head and the conveyance mechanism.

* * * * *